(12) United States Patent
Monfray et al.

(10) Patent No.: US 10,298,151 B2
(45) Date of Patent: May 21, 2019

(54) DEVICE FOR CONVERTING THERMAL ENERGY INTO ELECTRICAL ENERGY

(71) Applicants: STMicroelectronics (Crolles 2) SAS, Crolles (FR); STMicroelectronics SA, Montrouge (FR); Commissariat a l'Energie Atomique et aux Energies Alternatives, Paris (FR)

(72) Inventors: Stephane Monfray, Eybens (FR); Christophe Maitre, Barraux (FR); Olga Kokshagina, Paris (FR); Thomas Skotnicki, Crolles-Montfort (FR); Ulrich Soupremanien, Saint Egreve (FR)

(73) Assignees: STMicroelectronics (Crolles 2) SAS, Crolles (FR); STMicroelectronics SA, Montrouge (FR); Commissariat a l'Energie Atomique et aux Energies Alternatives, Paris (FR)

( * ) Notice: Subject to any disclaimer, the term of this patent is extended or adjusted under 35 U.S.C. 154(b) by 422 days.

(21) Appl. No.: 14/903,994

(22) PCT Filed: Aug. 18, 2014

(86) PCT No.: PCT/FR2014/052099
§ 371 (c)(1),
(2) Date: Jan. 8, 2016

(87) PCT Pub. No.: WO2015/025106
PCT Pub. Date: Feb. 26, 2015

(65) Prior Publication Data
US 2016/0173003 A1 Jun. 16, 2016

(30) Foreign Application Priority Data
Aug. 20, 2013 (FR) .................................. 13 58072

(51) Int. Cl.
*H02N 1/08* (2006.01)
*H02N 2/18* (2006.01)
(Continued)

(52) U.S. Cl.
CPC .............. *H02N 1/08* (2013.01); *B81B 3/0021* (2013.01); *B81B 3/0024* (2013.01); *F01K 5/02* (2013.01);
(Continued)

(58) Field of Classification Search
CPC . H02N 1/08; H02N 2/18; H02N 2/185; B81B 3/0021; B81B 3/0018;
(Continued)

(56) References Cited

U.S. PATENT DOCUMENTS 3,610,970 A * 10/1971 Skinner ................... H02M 7/54
310/10
4,041,446 A * 8/1977 Liebermann ........... G01H 11/06
367/181
(Continued)

FOREIGN PATENT DOCUMENTS

FR 2951874 A1 4/2011
FR 2972571 A1 9/2012

OTHER PUBLICATIONS

International Search Report and Written Opinion for PCT/FR2014/052099 dated Mar. 10, 2015 (9 pages).
(Continued)

*Primary Examiner* — Edgardo San Martin
(74) *Attorney, Agent, or Firm* — Crowe & Dunlevy

(57) ABSTRACT

A power conversion device includes an enclosure containing one or more drops of a liquid. A capacitive electret transducer is coupled to the enclosure. In response to applied heat at a heating surface, the liquid vaporizes and then condenses on a flexible membrane of the capacitive electret transducer.
(Continued)

The flexible membrane is displaced in response to the vaporization-condensation and the capacitive electret transducer generates an output current.

18 Claims, 1 Drawing Sheet

(51) Int. Cl.
  *H01L 41/113* (2006.01)
  *B81B 3/00* (2006.01)
  *H02N 1/00* (2006.01)
  *F01K 5/02* (2006.01)
  *H02N 1/06* (2006.01)
  *H01L 41/08* (2006.01)

(52) U.S. Cl.
  CPC ........ *H02N 1/006* (2013.01); *B81B 2203/053* (2013.01)

(58) Field of Classification Search
  CPC ... B81B 3/0024; B81B 2203/053; F01K 5/02; H01L 41/113; H01L 41/1138; H01L 37/02; H01L 37/00
  See application file for complete search history.

(56) References Cited

U.S. PATENT DOCUMENTS

| | | | | |
|---|---|---|---|---|
| 4,126,822 A * | 11/1978 | Wahlstrom | ............ | G04C 10/00 310/309 |
| 5,621,264 A * | 4/1997 | Epstein | ................ | H02N 2/185 310/339 |
| 5,677,965 A * | 10/1997 | Moret | ................ | H04R 19/005 381/113 |
| 6,750,590 B2 * | 6/2004 | Potter | ................... | H02N 1/08 310/309 |
| 6,750,596 B2 * | 6/2004 | Kim | ................... | H02N 2/18 310/339 |
| 7,034,440 B2 * | 4/2006 | Kim | ................... | H02N 2/18 310/324 |
| 7,378,775 B2 * | 5/2008 | Potter | ................ | H02N 1/08 310/309 |
| 7,446,450 B2 * | 11/2008 | Boland | ................ | H02N 1/08 290/1 R |
| 7,453,187 B2 * | 11/2008 | Richards | ................ | F02B 75/34 310/339 |
| 7,732,974 B1 * | 6/2010 | Boland | ................ | H02N 1/08 310/309 |
| 8,026,651 B2 * | 9/2011 | Wakabayashi | ........ | B06B 1/0292 310/344 |
| 8,378,558 B2 * | 2/2013 | Skotnicki | ................ | H02N 2/18 310/339 |
| 8,693,165 B2 * | 4/2014 | Skotnicki | ................ | H01L 37/02 361/301.5 |
| 8,704,386 B2 * | 4/2014 | Skotnicki | ................ | F03G 7/06 290/1 R |
| 8,773,003 B2 * | 7/2014 | Skotnicki | ................ | H02N 2/18 310/306 |
| 9,444,371 B2 * | 9/2016 | Ollier | ................ | H01L 41/047 |
| 9,735,707 B2 * | 8/2017 | Monfray | ................ | H02N 2/18 |
| 2001/0032663 A1 * | 10/2001 | Pelrine | ................ | F02G 1/043 136/205 |
| 2002/0043895 A1 * | 4/2002 | Richards | ................ | F02B 75/34 310/328 |
| 2003/0122448 A1 * | 7/2003 | Kim | ................ | H02N 2/18 310/311 |
| 2003/0160543 A1 * | 8/2003 | Lee | ................ | H02N 2/18 310/328 |
| 2004/0124738 A1 * | 7/2004 | Pelrine | ................ | F02G 1/043 310/307 |
| 2004/0150298 A1 * | 8/2004 | Styblo | ................ | H02N 2/18 310/339 |
| 2005/0093398 A1 * | 5/2005 | Kim | ................ | H02N 2/18 310/324 |
| 2005/0225213 A1 * | 10/2005 | Richards | ................ | F02B 75/34 310/339 |
| 2008/0067893 A1 * | 3/2008 | Peacock | ................ | H02N 2/18 310/322 |
| 2008/0202114 A1 * | 8/2008 | Naterer | ................ | F02G 1/043 60/508 |
| 2011/0095655 A1 * | 4/2011 | Skotnicki | ................ | H02N 2/18 310/339 |
| 2016/0241168 A1 * | 8/2016 | Mirshekari | ................ | H02N 2/18 |
| 2017/0103936 A1 * | 4/2017 | Soupremanien | .... | H01L 23/3735 |
| 2017/0317610 A1 * | 11/2017 | Loi | ................ | H02N 1/08 |

OTHER PUBLICATIONS

INPI Search Report and Written Opinion for FR 1358072 dated May 20, 2014 (7 pages).

* cited by examiner

DEVICE FOR CONVERTING THERMAL ENERGY INTO ELECTRICAL ENERGY

This application claims the priority benefit of French Patent application number 13/58072, the contents of which is hereby incorporated by reference.

BACKGROUND

The present disclosure relates to a device for converting thermal power into electric power, or thermoelectric generator. It more specifically relates to a device using a liquid-to-gas phase change of a fluid.

DISCUSSION OF THE RELATED ART

Devices for converting thermal power into electric power using a liquid-to-gas phase change of a fluid have already been provided.

In particular, U.S. Pat. No. 8,378,558 describes a device comprising a closed volume delimited by a first wall in contact with a hot source and, in front of the first wall, a second wall in contact with a cold source. The first wall is arranged above the second wall, and a layer of piezoelectric material is horizontally suspended in a closed volume between the two walls, this layer being crossed by vertical openings. The closed volume contains drops of a liquid. The device operates as follows.

The liquid flows by gravity through the openings towards the second wall. When it comes into contact with the second wall, it abruptly vaporizes, which results in generating mechanical stress which is transmitted to the piezoelectric layer, which turns it into electric signals.

The vapor passes through the openings in the piezoelectric layer towards the first wall, whereon it condenses.

The liquid flow is resumed towards the second wall and the cycle starts over.

French patent application No 1251368 filed on Feb. 14, 2012 describes another device for converting thermal power into electric power using a liquid-to-gas phase change of a fluid. This device enables to do away with the need to direct the cold wall above the hot wall to ensure the flow of liquid towards the hot wall after its condensing on the cold wall. To achieve this, the device comprises a first cavity having a wall in contact with a hot source, a second cavity having a wall in contact with a cold source, a piezoelectric material arranged in at least one of the cavities, a primary channel connecting the first and second cavities, and at least one secondary channel connecting the first and second cavities. A fluid in liquid or gas form is confined in the device. The secondary channel is capable of transporting the fluid in the form of gas. The primary channel is capable of transporting drops of the fluid in liquid form from the second cavity to the first cavity, including when the second cavity is located under the first cavity. To achieve this, the primary channel comprises means for ensuring the displacement of liquid drops from the second cavity to the first cavity. Such means are for example formed by the internal surface of the primary channel, which may comprise sections having different wettabilities along the longitudinal axis of the channel, or may be of electrostatic type.

It would however be desirable to at least partly improve certain aspects of existing devices for converting thermal power into electric power using a liquid-to-gas phase change of a fluid.

SUMMARY

Thus an embodiment provides a power conversion device, comprising an enclosure containing drops of a liquid and a capacitive electret transducer coupled to this enclosure.

According to an embodiment, the transducer comprises a flexible electrode forming a wall of the enclosure.

According to an embodiment, the flexible electrode comprises a grapheme or amorphous carbon film.

According to an embodiment, the flexible electrode comprises a metal sheet.

According to an embodiment, the transducer further comprises a rigid electrode arranged in front of the flexible electrode outside of the enclosure.

According to an embodiment, the transducer further comprises an electret layer between the flexible electrode and the rigid electrode.

According to an embodiment, the electret layer is in contact with a surface of the rigid electrode.

According to an embodiment, the device comprises a first wall intended to be placed in contact with a hot source at a temperature higher than the vaporization temperature of the liquid, and a second wall intended to be placed in contact with a cold source at a temperature lower than the vaporization temperature of the liquid.

According to an embodiment, the device comprises a first cavity in the vicinity of the first wall, and a second cavity in the vicinity of the second wall, the first cavity being separated from the second cavity by a layer of a thermally-insulating material.

According to an embodiment, the layer of thermally-insulating material is crossed by openings connecting the first cavity to the second cavity.

According to an embodiment, at least one of the openings comprises means ensuring the transport of drops of the liquid from the second cavity to the first cavity.

BRIEF DESCRIPTION OF THE DRAWINGS

The foregoing and other features and advantages of the present invention will be discussed in detail in the following non-limiting description of specific embodiments in connection with the accompanying drawings, wherein.

DETAILED DESCRIPTION

Figure 1:
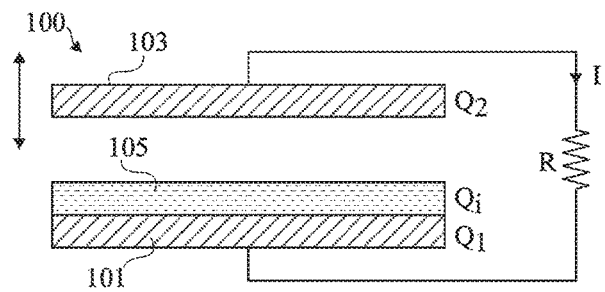
FIG. 1 is a diagram illustrating the operating principle of a capacitive electret transducer.

For clarity, the same elements have been designated with the same reference numerals in the various drawings and, further, the various drawings are not to scale. Further, in the following description, unless otherwise indicated, terms "approximately", "substantially", "around", and "in the order of" mean "to within 10%", and terms referring to directions, such as covering, topping, lateral, above, under, upper, lower, vertical, horizontal, etc. apply to devices arranged as illustrated in the cross-section views of the corresponding drawings.

An aspect of an embodiment provides a device capable of converting thermal power into mechanical power by means of a liquid abruptly vaporizing when it comes into contact with a hot surface, thus creating a localized overpressure, and of converting this overpressure into electric power by means of a capacitive electret transducer.

FIG. 1 schematically illustrates an example of a capacitive electret transducer 100. Transducer 100 comprises a fixed electrode 101, and, in front of electrode 101, a mobile electrode 103. In this example, electrodes 101 and 103 are substantially planar and parallel to each other and electrode 103 is capable of shifting along an axis approximately orthogonal to electrodes 101 and 103.

Electrode 101 is coated with an electret layer 105. Electret here designates an electrically-charged dielectric material, capable of holding its charges or a significant part of its charges for a long period, typically from a few years to a few tens of years.

In the shown example, a load, schematically shown as a resistor R, is connected between electrodes 101 and 103 of transducer 100.

Transducer 100 operates as follows.

Electret layer 105, which contains a quantity $Q_i$ of charges of a first polarity for example, negative charges, induces in electrodes 101 and 103 a building up of charges of inverse polarity, positive charges in this example. Calling $Q_1$ the quantity of charges induced in electrode 101 by layer 105, and $Q_2$ the quantity of charges induced in electrode 103 by layer 105, equilibrium $Q_i=Q_1+Q_2$ is respected at any time.

A displacement of electrode 103 relative to electrode 101 causes a reorganization of the charges induced in electrodes 101 and 103 by electret layer 105. In particular, when electrode 103 moves away from electrode 101, quantity $Q_2$ of charges induced in electrode 103 decreases and quantity $Q_1$ of charges induced in electrode 101 increases. Conversely, when electrode 103 moves towards electrode 101, quantity $Q_2$ of charges induced in electrode 103 increases and quantity $Q_i$ of charges induced in electrode 101 decreases. As a result, a current I flows through load R. The relative motion of electrode 103 with respect to electrode 101 is thus converted into electricity.

Figure 2:
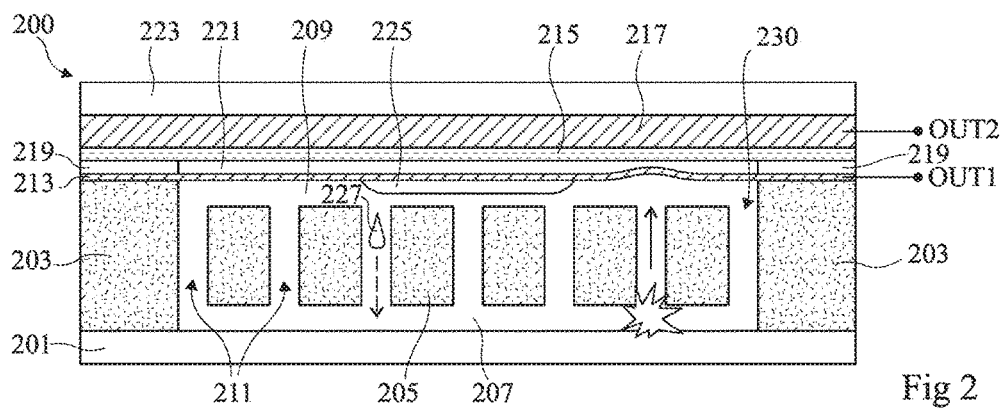
FIG. 2 is a simplified cross-section view illustrating an embodiment of a thermoelectric generator.

FIG. 2 is a cross-section view schematically illustrating an embodiment of a device 200 for converting thermal power into electric power.

Device 200 comprises a lower wall 201 intended to be in contact with a hot source. The hot source may be an electronic component, for example, an integrated circuit chip. In this case, wall 201 may be an upper surface of the integrated circuit chip. The described embodiments are however not limited to this specific case. As a variation, wall 201 may be a plate of metal or of another material, and the hot source may be any heat source available in the environment, for example, a car exhaust pipe, a duct, a machine wall, etc.

Device 200 further comprises approximately vertical lateral walls 203 made of a thermally-insulating material, for example, glass, silicon oxide, or any other suitable material. In this example, lateral walls 203 are laid on a peripheral portion of the upper surface of wall 201.

Device 200 further comprises, above wall 201, a layer 205 of thermally-insulating material, for example, made of the same material as lateral walls 203. In this example, the thickness of layer 205 is smaller than the height of lateral walls 203, and layer 205 is approximately horizontally suspended above wall 201, for example, at mid-height of walls 203. A cavity 207 separates layer 205 from wall 201, and a cavity 209 is located between layer 205 and the plane comprising the upper surface of lateral walls 203. As an example, layer 205 and lateral walls 203 may be one piece, for example, obtained by molding or by any other convenient method. As a variation, layer 205 and lateral walls 203 may be separate elements, assembled by any suitable means, for example, by gluing. Layer 205 is crossed by a network of approximately vertical openings 211, for example, through holes or channels having a circular cross-section. As a non-limiting embodiment, lateral walls 203 may have a height in the range between 100 µm and 1 cm, cavities 207 and 209 may have a height in the range between 100 nm and 5 mm, and openings 211 may have a diameter in the range between 100 nm and 5 mm.

Device 200 further comprises a flexible electrode 213 suspended above layer 205 and cavity 209. In this example, a peripheral portion of the lower surface of electrode 213 is attached to the upper surface of lateral walls 203, for example, by gluing. Flexible electrode 213 for example is a conductive graphene or amorphous carbon film, or a thin metal sheet.

Device 200 further comprises, above flexible electrode 213, an electret layer 215 having its upper surface in contact with a rigid electrode 217. The stack formed by electret layer 215 and by electrode 217 is supported by a ring 219 of a thermally-conductive and electrically-insulating material, for example, resin. Ring 219 itself is supported by a peripheral portion of the upper surface of electrode 213, above lateral walls 203 of the device. Flexible electrode 213 is thus separated from electret layer 215 by a cavity 221 having its height depending on the thickness of ring 219.

Electret layer 215 is for example made of charged TEFLON, of charged parylene, or of any other dielectric material electrically charged, for example, by corona discharge and capable of holding its charges for a long period. As a variation, electret layer 215 may comprise a stack of one or several dielectric layers, for example, made of silicon oxide and/or of nitride, sandwiched between two TEFLON or parylene films. Charges may for example be stored in the central dielectric, for example, by corona discharge, the TEFLON or parylene films having the function of preventing the discharge of the central dielectric. As a variation, electret layer 215 may comprise a stack of one or several dielectric layers, for example, made of silicon oxide and/or of nitride, sandwiched between two films of hexamethyldisiloxane, generally designated as HMDS in the art. It should be noted that HMDS does not intrinsically have electret properties, but the performed tests have shown that, after encapsulation between two HMDS layers, a stack of dielectric, for example, oxide-nitride, may have electret properties, that is, it may hold electric charges for a long period. More generally, electret layer 215 may be made of any material or combination of materials having electret properties.

Electrodes 213 and 217 and electret layer 215 form a capacitive electret transducer. Electrodes 213 and 217 for example respectively correspond to the mobile electrode and to the fixed electrode of a transducer of the type described in relation with FIG. 1. In this example, electrodes 213 and 217 are respectively connected to output nodes or terminals OUT1 and OUT2 of conversion device 200.

In this example, device 200 further comprises an approximately horizontal upper wall 223 topping electrode 217, intended to be in contact with a cold source. The cold source for example is a fin-type radiator, or directly ambient air, or any other source having a temperature lower than that of the hot source. It should be noted that in this example, wall 223 is distinct from electrode 217. As a variation, wall 223 and electrode 217 may be a same element.

Walls 201 and 223 are preferably made of good heat conductors, to provide a homogeneous temperature distribution in cavities 207 (hot cavity) and 209 (cold cavity)

respectively. It should be noted that in the example of FIG. 2, cavity 209 is separated from wall 223 by the capacitive electret transducer. However, in practice, the different transducer elements are sufficiently thin and/or good thermal conductors to avoid significantly disturbing the cooling of cavity 209 by the cold source, such a cooling being anyway performed by the thermally-conductive material of ring 219. As a non-limiting example, flexible electrode 213 may have a thickness in the range between 1 nm and 100 µm, cavity 221 may have a height in the range between 10 nm and 2 mm, electret layer 215 may have a thickness in the range between 50 nm and 20 µm, and rigid electrode 217 may have a thickness in the range between 10 µm and 3 mm.

Cavities 207 and 209 and openings 211 form a closed volume, preferably tight, delimited by walls 201 and 203 and by flexible electrode 213 which thus define an enclosure 230. In this volume, a liquid 225 is introduced before sealing. Liquid 225 is selected so that its boiling temperature is lower than the temperature of cavity 207 (hot cavity) or of wall 201 in operation, and higher than the temperature of cavity 209 (cold cavity) or of electrode 213 in operation. As an example, ethanol or methanol having boiling temperatures respectively in the order of 78° C. and 65° C. at the atmospheric pressure may be used. Water or any other liquid may also be used and the closed volume formed by cavities 207 and 209 and by openings 211 may be set to a pressure selected to obtain the desired boiling temperature.

Device 200 operates as follows:

When a drop of liquid 225 runs down along an opening 211 and reaches hot wall 201, it abruptly passes from the liquid state to the gaseous state. Such a fast state change locally generates a strong overpressure. Such an overpressure locally causes a temporary deformation of flexible electrode 213 above opening 211. Locally, flexible electrode 213 is then capable of moving towards or away from electrode 217, which causes the occurrence of an electric signal between output nodes OUT1 and OUT2 of the device. The electrical power of this signal may either be directly used to power a load, or stored in a battery or another storage system, or recovered by a system for collecting and for shaping the collected electric power.

After the fast vaporization step, the vapor condenses on the side of electrode 213, in cold cavity 209, and flexible electrode 213 locally recovers its initial shape. Electrode 213, as illustrated in FIG. 2, has a liquid accumulation 225 forming thereon. When the mass of liquid 225 increases, drops 227 fall back into openings 211 towards hot wall 201, and the cycle is resumed.

Figure 3:
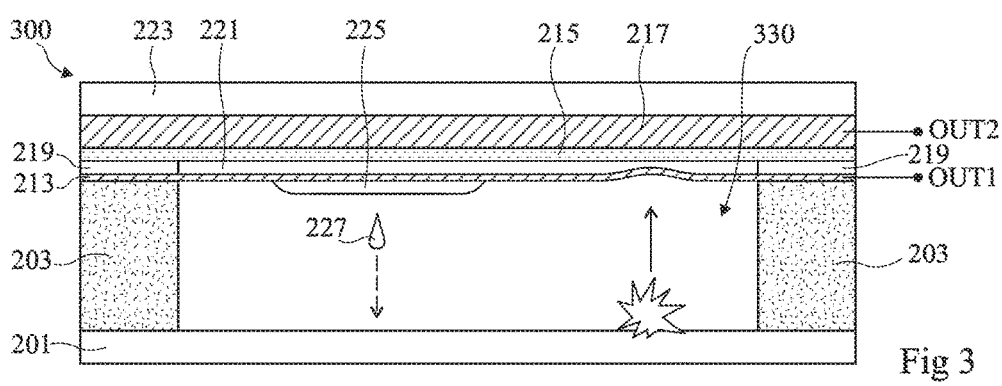
FIG. 3 is a simplified cross-section view illustrating another embodiment of a thermoelectric generator.

FIG. 3 is a simplified cross-section view illustrating an alternative embodiment of the device for converting thermal power into electrical power of FIG. 2. Device 300 of FIG. 3 comprises many elements common with the device of FIG. 2. Only the differences between the two devices will be described hereafter.

Device 300 of FIG. 3 differs from the device of FIG. 2 in that it does not comprise thermally-insulating layer 205 horizontally suspended in enclosure 330 containing liquid 225, between walls 201, 213, and 203, which define this enclosure.

In device 300, drops 227 of liquid displacing from the cold wall (electrode 213) to the hot wall (wall 201) of the enclosure, and the vapors and overpressures displacing from the hot wall (wall 201) to the cold wall (electrode 213) of the enclosure are not, as in the device of FIG. 2, channeled by openings 211 crossing layer 205, but may freely move, at any point of the surface of the device in top view. An advantage is that the number of fast vaporization/condensation cycles per surface area unit may be greater than in device 200.

Figure 4:
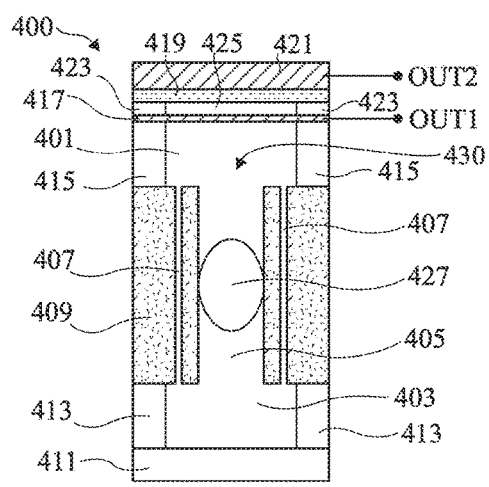
FIG. 4 is a simplified cross-section view illustrating another embodiment of a thermoelectric generator.

FIG. 4 is a simplified cross-section view illustrating another embodiment of a device 400 for converting thermal power into electric power.

Device 400 comprises a first cavity 401, a second cavity 403, a channel 405 or primary channel connecting cavity 401 to cavity 403, and a channel 407 or secondary channel connecting cavity 401 to cavity 403. In the shown example, primary channel 405 is a rectilinear channel having a circular cross-section, and secondary channel 407 is a rectilinear channel having a ring-shaped cross-section, its smaller diameter being greater than the diameter of the primary channel, primary and secondary channels 405 and 407 having the same longitudinal axis. The described embodiments are however not limited to this specific case. Primary and secondary channels 405 and 407 thoroughly cross a layer 409 made of a thermally-insulating material, which separates cavity 401 from cavity 403.

Cavity 403 is closed by an end wall 411, substantially parallel to layer 409, and by lateral walls 413 connecting wall 411 to layer 409.

Cavity 401 is delimited by lateral walls 415 and by a flexible electrode 417 suspended above layer 409 and attached to the upper surface of lateral walls 415. Device 400 further comprises, above flexible electrode 417, an electret layer 419 having its upper surface in contact with a rigid electrode 421. The stack formed by electret layer 419 and by electrode 421 is supported by a ring 423 of thermally-conductive and electrically-insulating material, for example, resin. Ring 219 itself rests on a peripheral portion of the upper surface of electrode 417, above lateral walls 415 of cavity 401. A cavity 425 thus separates electret layer 419 from electrode 421.

Electrodes 417 and 421 and electret layer 419 form a capacitive electret transducer. In this example, electrodes 417 and 421 are respectively connected to output nodes or terminals OUT1 and OUT2 of conversion device 400.

In operation, wall 411 is intended to be placed in contact with a cold source, and electrode 421 is intended to be placed in contact with a hot source.

Cavities 401 and 403 and channels 405 and 407 form a closed volume delimited by walls 411, 413, and 415 and by flexible electrode 417, which thus define an enclosure 430. A liquid 427 is introduced in this volume. Liquid 427 is selected so that its boiling temperature is lower than the temperature of cavity 401 (hot cavity) in operation, and higher than the temperature of cavity 403 (cold cavity) in operation.

According to an aspect of the example of FIG. 4, primary channel 405 comprises an inner surface such that it ensures the displacements of drops of the liquid from cavity 403 to cavity 401, independently from the direction of device 400. For this purpose, the inner surface of the device may comprise sections having different wettabilities, distributed along the longitudinal axis of the channel, to form a surface having a surface energy gradient.

Device 400 operates as follows.

When a drop of liquid 427 reaches hot cavity 401, it abruptly passes from the liquid state to the gaseous state. Such a fast state change locally generates a strong overpressure. Such an overpressure causes a temporary deformation of flexible electrode 417, which causes the occurrence of an electric signal between output nodes OUT1 and OUT2 of the device.

After the fast vaporization step, the vapor is transmitted by channels 405 and 407 and condenses on the side of cold cavity 403. A drop then forms in cold cavity 403. This drop is transported towards hot cavity 401 by channel 405, and the cycle is resumed.

Primary channel 405 has a sufficiently large opening to leave way for drops of liquid 427, and secondary channel 407 has an opening which is too small for drops, but sufficiently large to transmit vaporized liquid or pressure. In the case of water, the diameter of primary channel 405 preferably is in the order of the capillary length, for example between 3 and 5 mm, advantageously in the order of 4 mm, and the diameter of the secondary channel preferably is in the order of the capillary length divided by 10, for example, smaller than 0.5 mm. Secondary channel 407 especially has the function of balancing the pressure between cavities on transfer of the drop from cavity 403 to cavity 401, to avoid for a depression to create in cavity 403, which might block the transfer of the drop.

An advantage of the embodiment of FIG. 4 is that the device operation is independent from gravity. The device may thus be arranged in any direction.

An advantage of the above-described embodiments results from the fact that the conversion of a local overpressure into electric power is performed by means of a capacitive electret transducer. This enables, for equivalent overpressures due to the abrupt evaporation of the liquid, to obtain electric signals of much higher amplitudes than in prior art devices where the mechano-electrical conversion is performed by means of a piezoelectric transducer.

Specific embodiments have been described. Various alterations, modifications, and improvements will readily occur to those skilled in the art.

In particular, in the examples of FIGS. 2 and 3, the capacitive electret transducer is placed on the side of the cold source. As a variation, the transducer may be placed on the hot source side, or two transducers may be provided, one on the hot source side and the other on the cold source side.

Further, in the example of FIG. 4, the capacitive electret transducer is placed on the hot source side. As a variation, the transducer may be placed on the cold source side, or two transducers may be provided, one on the hot source side and the other on the cold source side.

Further, in the above-described examples, the electret layer of the capacitive electret transducer is formed on a surface of the rigid electrode of the transducer. As a variation, the electret layer may be placed on a surface of the flexible electrode of the transducer. In this case, it should however be ascertained for the stack of the flexible electrode and of the electret layer to remain sufficiently flexible to obtain the desired operation.

Further, it will be within the abilities of those skilled in the art to adapt the described embodiments to the various alternative embodiments of thermoelectric generators described in above-mentioned U.S. Pat. No. 8,378,558 and in the above-mentioned French patent application No. 1251368 filed on Feb. 14, 2012. The content of these two documents is incorporated herein by reference to the maximum extent allowable by law.

The invention claimed is:

1. A power conversion device, comprising:
an enclosure containing drops of a liquid;
a capacitive electret transducer within the enclosure, the capacitive electret transducer comprising:
a rigid electrode, wherein a majority of a length of the rigid electrode is in physical contact with an interior wall of the enclosure;
an electret layer in physical contact with the rigid electrode; and
a flexible electrode spaced apart from the rigid electrode by free space such that the flexible electrode and electret layer are not in physical contact with one another when the flexible electrode is not deformed, but are in physical contact with one another when the flexible electrode is sufficiently deformed.

2. The power conversion device of claim 1, wherein the flexible electrode comprises a graphene or amorphous carbon film.

3. The power conversion device of claim 1, wherein the flexible electrode comprises a metal sheet.

4. The power conversion device of claim 1, wherein the electret layer is in physical contact with a surface of the rigid electrode.

5. The power conversion device of claim 1, wherein the enclosure comprises a first wall configured to be placed in contact with a hot source at a temperature higher than a vaporization temperature of the liquid, and a second wall configured to be placed in contact with a cold source at a temperature lower than the vaporization temperature of the liquid, wherein the interior wall of the enclosure in physical contact with the rigid electrode is the first wall, with the rigid electrode being in physical contact with an interior surface of the first wall.

6. The power conversion device of claim 5, comprising a first cavity in the vicinity of the first wall, and a second cavity in the vicinity of the second wall, the first cavity being separated from the second cavity by a layer of a thermally-insulating material.

7. The power conversion device of claim 6, wherein said layer of thermally-insulating material is crossed by openings connecting the first cavity to the second cavity.

8. The power conversion device of claim 7, wherein at least one of said openings comprises means ensuring transport of drops of the liquid from the second cavity to the first cavity.

9. A power conversion device, comprising:
an enclosure containing at least a drop of liquid;
a flexible conductive membrane suspended within the enclosure and movable in response to change of liquid-gas state of said drop of liquid;
an electret layer spaced from said flexible conductive membrane; and
a conductive layer in contact with said electret layer and in physical contact with a majority of a length of an interior wall of the enclosure.

10. The power conversion device of claim 9, wherein said flexible conductive membrane is formed of a graphene or amorphous carbon film.

11. The power conversion device of claim 9, further comprising an insulating material suspended within the enclosure containing the drop of liquid, said insulating material including at least one opening.

12. The power conversion device of claim 11, wherein said at least one opening comprises a plurality of openings.

13. The power conversion device of claim 11 wherein said at least one opening comprises a central opening and an annular opening concentric with the central opening.

14. The power conversion device of claim 11, wherein said enclosure includes:
a first wall configured to be placed in contact with a heat source at a temperature higher than a vaporization temperature of the liquid, wherein the first wall is the interior wall in physical contact with the conductive layer; and a second wall configures to be placed in contact with a cold source at a temperature lower than the vaporization temperature of the liquid.

15. A device for converting thermal energy into electrical energy, comprising:
    an enclosure containing drops of liquid;
    an electret transducer in fluid communication with the enclosure, comprising:
        an electret material attached to an interior wall of the enclosure and in physical contact with a majority of a length of the interior wall, the electret material producing an electric field in an absence of a voltage applied thereto; and
        flexible electrodes positioned relative to the electret material and the liquid such that a liquid-vapor phase change of the liquid caused by the thermal energy causes deformation of at least one of the flexible electrodes such that a position of that flexible electrode relative to the electret material changes, wherein the changing of the position of that flexible electrode relative to the electret material results in change of position of that flexible electrode relative to the electric field such that a voltage is produced across the flexible electrodes.

16. The device of claim 15, further comprising an insulating material suspended within the enclosure containing the drop of liquid, said insulating material including at least one opening.

17. The device of claim 16, wherein said at least one opening comprises a plurality of openings.

18. The device of claim 16, wherein said at least one opening comprises a central opening and an annular opening concentric with the central opening.

* * * * *